(12) United States Patent
Dyer et al.

(10) Patent No.: US 11,612,071 B2
(45) Date of Patent: Mar. 21, 2023

(54) FLEXIBLE THROAT/DUCT BETWEEN CABINETS

(71) Applicant: S&C Electric Company, Chicago, IL (US)

(72) Inventors: Thomas J Dyer, Minneola, FL (US); Joseph W Milton, Milwaukee, WI (US)

(73) Assignee: S&C Electric Company, Chicago, IL (US)

( * ) Notice: Subject to any disclaimer, the term of this patent is extended or adjusted under 35 U.S.C. 154(b) by 0 days.

(21) Appl. No.: 17/489,952

(22) Filed: Sep. 30, 2021

(65) Prior Publication Data

US 2022/0109292 A1    Apr. 7, 2022

Related U.S. Application Data

(60) Provisional application No. 63/086,214, filed on Oct. 1, 2020.

(51) Int. Cl.
*H05K 5/02* (2006.01)
*H02G 3/04* (2006.01)

(52) U.S. Cl.
CPC ......... *H05K 5/0247* (2013.01); *H02G 3/0487* (2013.01)

(58) Field of Classification Search
CPC ..... H02G 3/088; H02G 3/0487; H05K 5/0247
See application file for complete search history.

(56) References Cited

U.S. PATENT DOCUMENTS 3,742,119 A * 6/1973 Newman ................. H02B 1/305
                                                        174/559
5,704,400 A * 1/1998 Eldridge ..................... F16L 5/12
                                                         285/32

* cited by examiner

*Primary Examiner* — James Wu

(57) ABSTRACT

A duct assembly for covering electrical connections between electrical equipment enclosures having a gap therebetween. The duct assembly includes a first frame configured to be mounted to one of the enclosures, where the first frame includes a flange mounted to the enclosure and a flange to which a gasket is secured that extends all of the way around the first frame. The duct assembly also includes a second frame configured to be mounted to the other enclosure, where the second frame includes a flange mounted to the enclosure and a flange to which a gasket is secured that extends all of the way around the second frame. The duct assembly further includes a duct that compresses and is coupled only to the gaskets that enclose each end of the gap.

16 Claims, 4 Drawing Sheets

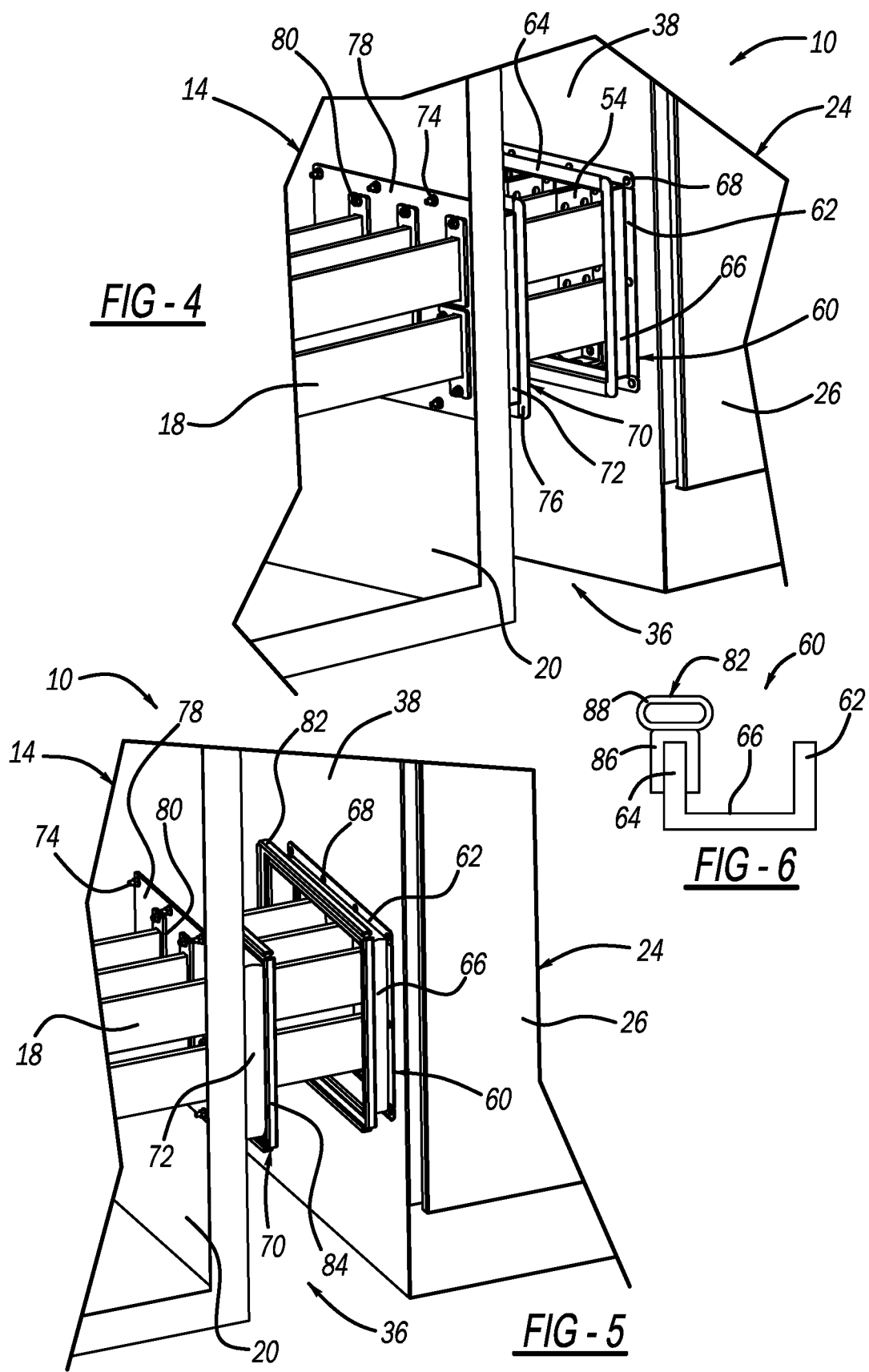

FLEXIBLE THROAT/DUCT BETWEEN CABINETS

CROSS-REFERENCE TO RELATED APPLICATION

This application claims the benefit of priority from the U.S. Provisional Application No. 63/086,214, filed on Oct. 1, 2020, the disclosure of which is hereby expressly incorporated herein by reference for all purposes.

BACKGROUND

Field

This disclosure relates generally to a duct assembly for covering electrical connections extending between electrical equipment enclosures and, more particularly, to a duct assembly for covering electrical connections extending between electrical equipment enclosures, where the duct assembly includes a first frame having a bulb gasket and being attached to one of the enclosures, a second frame having a bulb gasket and being attached to the other enclosure, and a cover secured to the frames by compressing the gaskets.

Discussion of the Related Art

An electrical power distribution system, often referred to as an electrical grid, typically includes a vast network of power lines for delivering power to a number of loads, such as homes, businesses, etc. These power distribution systems employ many types and varieties of equipment, components, devices, etc., for example, switchgear, transformers, etc. Often times these components are housed in large metal electronics and equipment cabinets and other types of enclosures that have a large front opening, for example, four to six feet wide, covered by two doors to allow access to the components and devices therein.

The devices and components enclosed within these electronics cabinets usually need to be electrically connected to certain equipment including by high voltage AC buses. For example, a large power converter cabinet would likely be electrically connected to a medium voltage transformer provided within an enclosure. Usually it is desirable to position an electronics cabinet near the equipment it is connected to so as to minimize the length of the connections between them. Access panels are provided in the cabinet and equipment enclosures that need to be weather sealed. Ducts are sometimes employed to cover the connections between the cabinets and enclosures, which also need to be weather sealed. However, the cabinets and enclosures, and thus the access panels, can't always be perfectly aligned because of various things, such as the unevenness in the ground, where one of the enclosures may be slightly tilted. These misalignments create stresses on the ducts and gaskets, which could lead to loss of sealing integrity and premature failures.

SUMMARY

The following discussion discloses and describes a duct assembly for covering electrical connections between electrical equipment enclosures having a gap therebetween. The duct assembly includes a first frame configured to be mounted to one of the enclosures, where the first frame includes a flange mounted to the enclosure and a flange to which a gasket is secured that extends all of the way around the first frame. The duct assembly also includes a second frame configured to be mounted to the other enclosure, where the second frame includes a flange mounted to the enclosure and a flange to which a gasket is secured that extends all of the way around the second frame. The duct assembly further includes a duct that compresses and is coupled only to the gaskets that enclose each end of the gap.

Additional features of the disclosure will become apparent from the following description and appended claims, taken in conjunction with the accompanying drawings.

BRIEF DESCRIPTION OF THE DRAWINGS

FIG. 4 is a broken-away isometric view of the equipment assembly shown in FIG. 1 showing the connections between the enclosure and the cabinet;

FIG. 5 is a broken-away isometric view of the equipment assembly shown in FIG. 1 including a bulb gasket secured to a flange on the frames;

FIG. 6 is a cross-sectional view of one of the rails of one of the frames showing the bulb gasket;

DETAILED DESCRIPTION OF THE EMBODIMENTS

The following discussion of the embodiments of the disclosure directed to a duct assembly for covering electrical connections between equipment enclosures is merely exemplary in nature, and is in no way intended to limit the disclosure or its applications or uses.

Figure 1:
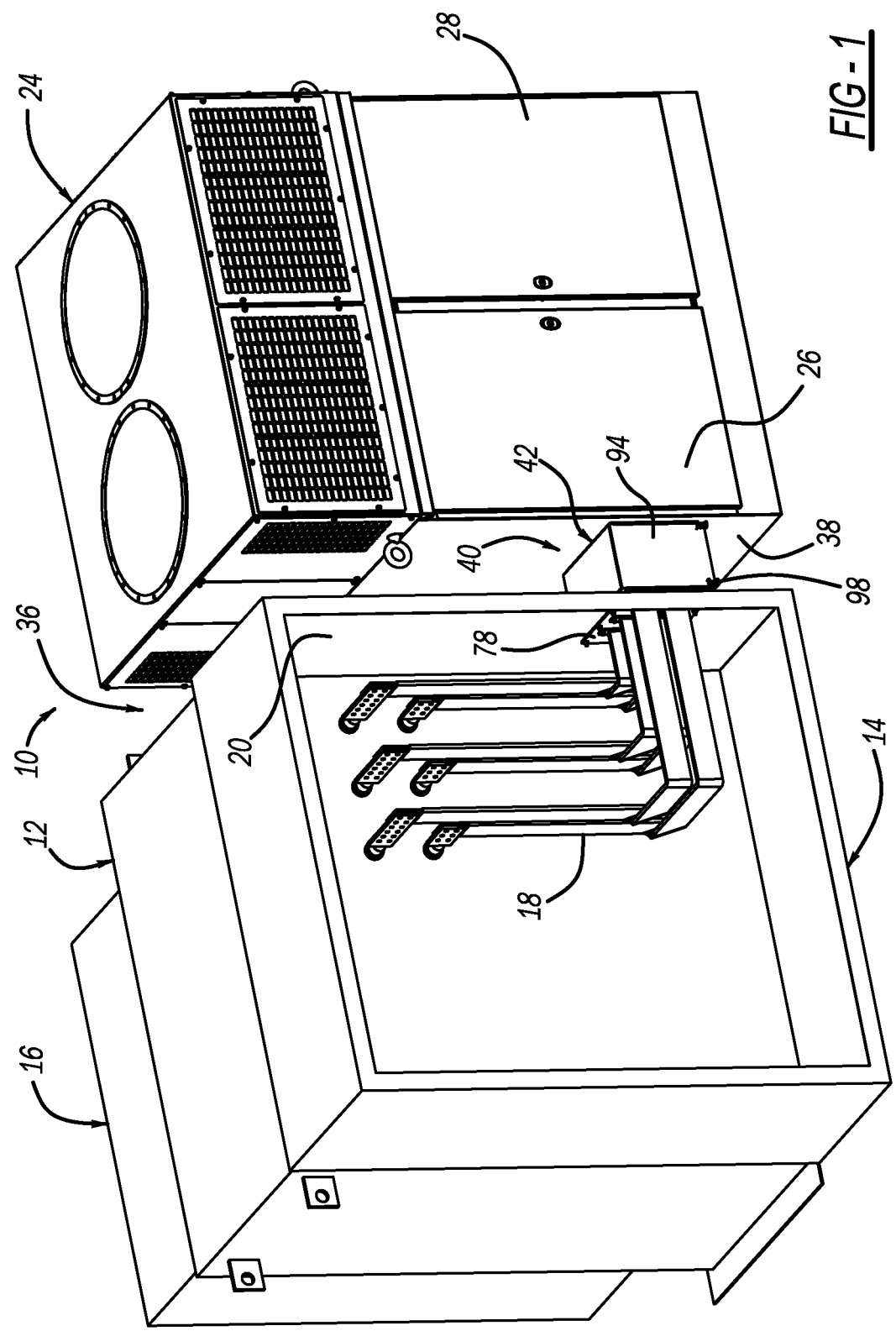
FIG. 1 is an isometric view of an electrical equipment assembly including a transformer enclosure and an equipment cabinet that are spaced apart and a duct assembly covering connections extending between the enclosure and the cabinet.

FIG. 1 is an isometric view of an equipment assembly 10 including a transformer enclosure 12 for enclosing a transformer (not shown) and having a front transformer termination cabinet 14 and cooling fins 16 for the transformer, where power connection buses 18, here six, are shown mounted to the cabinet 14 and being connected to the transformer enclosure 12 and extending through an opening in a wall 20 of the cabinet 14. Although only power buses are shown in this example, other electrical connections can also be provided between the enclosure 12 and the cabinet 14. The assembly 10 also includes an equipment cabinet 24 for housing electrical equipment (not shown), such as a power converter system, and having opposing doors 26 and 28 for accessing the cabinet 24, where the enclosure 12 and the cabinet 24 are spaced close together, but separated by a gap 36. The connection buses 18 cross the gap 36, extend through an opening in a wall 38 of the cabinet 24 and are connected to some of the equipment housed in the cabinet 24. The equipment assembly 10 includes a duct assembly 40 having a flexible duct 42 that covers the connection buses 18 extending across the gap 36, as will be discussed in detail below. It is noted that the specific embodiment discussion herein where the duct assembly 40 is used in connection with a transformer enclosure and a power converter cabinet is merely for illustrative purpose in that the duct assembly 40 can be used in connection with other types of the electrical equipment cabinets and enclosures.

Figure 2:
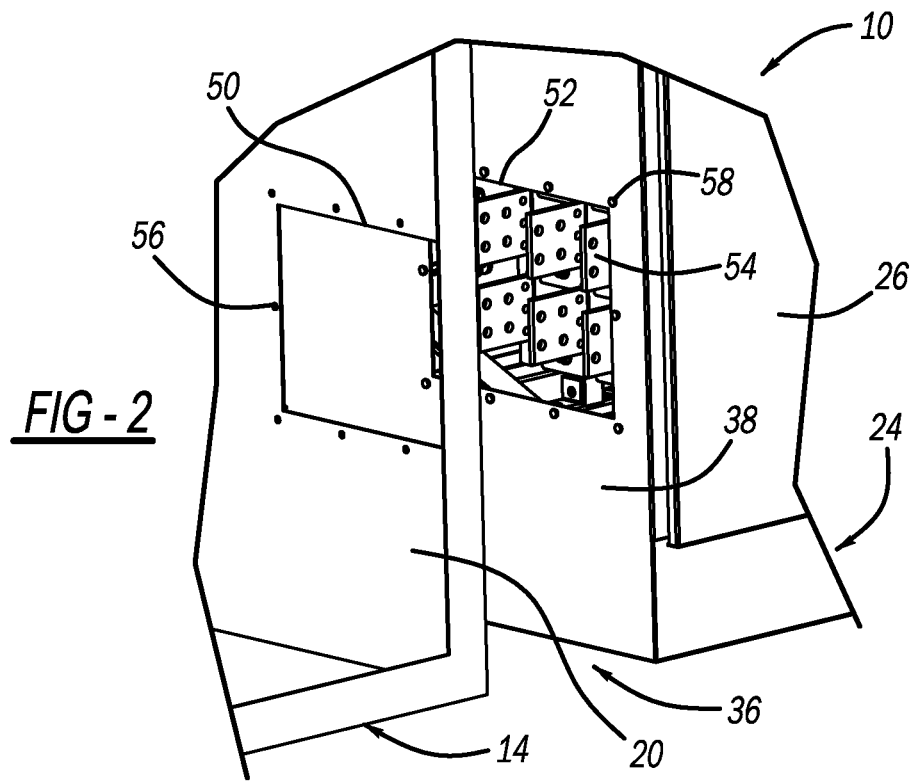
FIG. 2 is a broken-away isometric view of the equipment assembly shown in FIG. 1 with the duct assembly removed and exposing aligned openings in the enclosure and the cabinet for accepting the connections.

FIGS. 2-8 illustrate assembly and other details of the duct assembly 40. FIG. 2 is a broken-away isometric view of the equipment assembly 10 with the connection buses 18 and the duct assembly 40 removed and showing a square opening 50 in the wall 20 and a square opening 52 in the wall 38, where the cabinets 14 and 24 have been positioned so that the openings 50 and 52 are aligned with each other. The opening 52 exposes connector tabs 54 inside of the cabinet 24 to which the connection buses 18 are secured to so that the transformer is electrically coupled to the equipment in the cabinet 24. Bolt holes 56 are provided around the opening 50 and bolt holes 58 are provided around the opening 52.

Figure 3:
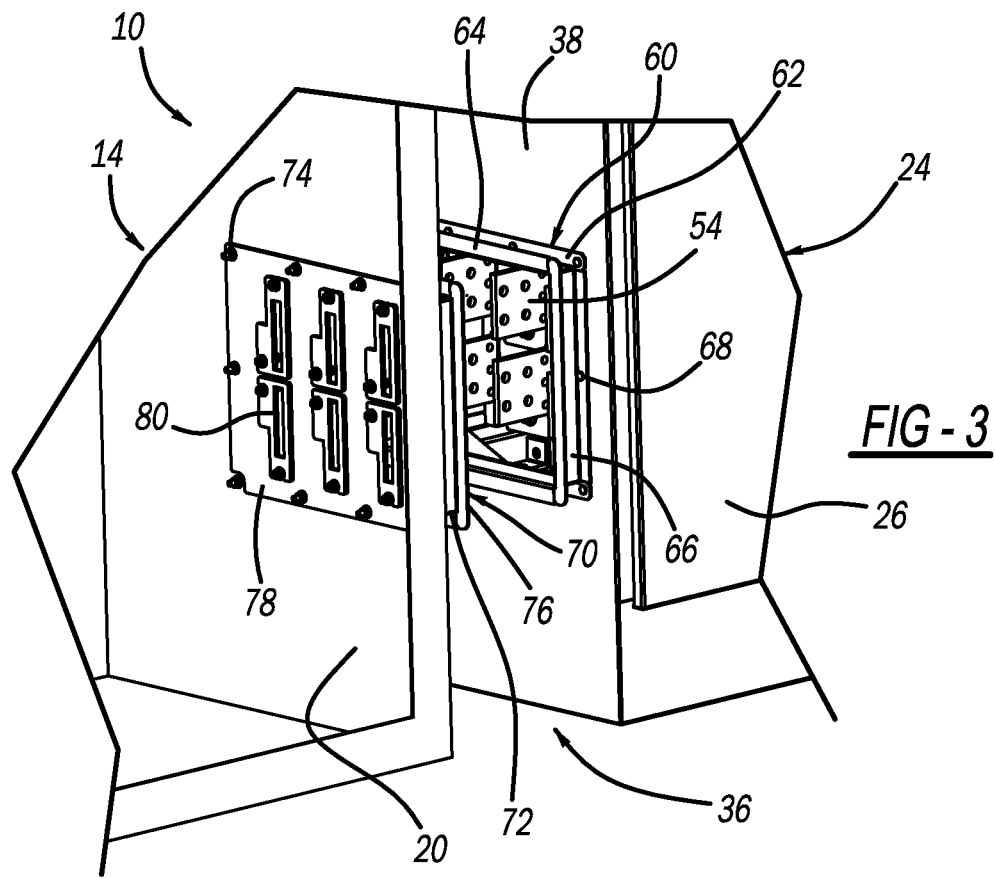
FIG. 3 is a broken-away isometric view of the equipment assembly shown in FIG. 1 including frames bolted to the opposing walls of the enclosure and the cabinet and encircling the openings.

FIG. 3 is a broken-away isometric view of the equipment assembly 10 showing a square frame 60 having a U-shaped cross-section defined by opposing flanges 62 and 64 and a channel 66 therebetween, where the flange 62 is bolted to the wall 38 using bolts 68 extending through the bolt holes 58 so that the flange 64 is positioned within the gap 36. It is noted that a weather sealing gasket (not shown) would be provided between the flange 62 and the wall 38. FIG. 3 also shows a square frame 70 having a U-shaped cross-section defined by opposing flanges and a channel 72 therebetween, where one of the flanges is bolted to the wall 20 using bolts 74 extending through the bolt holes 56 so that a flange 76 is positioned within the gap 36. When the frame 70 is bolted to the wall 20, a block-off plate 78 is also bolted to an inside surface of the wall 20 using the same bolts 74, where the plate 78 includes alignment slots 80 through which the connection buses 18 extend. It is noted that the openings 50 and 52 and/or the frames 60 and 70 can have various shapes other than square.

FIG. 4 is a broken-away isometric view of the equipment assembly 10 showing the connection buses 18 inserted through the slots 80 and connected to the tabs 54.

FIG. 5 is a broken-away isometric view of the equipment assembly 10 showing a rubber bulb gasket 82 secured to the flange 64 all of the way around the frame 60 and a rubber bulb gasket 84 secured to the flange 76 all of the way around the frame 70.

FIG. 6 is a cross-sectional type view of one rail of the frame 60 that illustrates the bulb gasket 82 having a U-shaped connection portion 86 secured to the flange 64 and an oval-shaped sealing portion 88 coupled thereto and extending therefrom, where the bulb gasket 84 has the same design.

Figure 7:
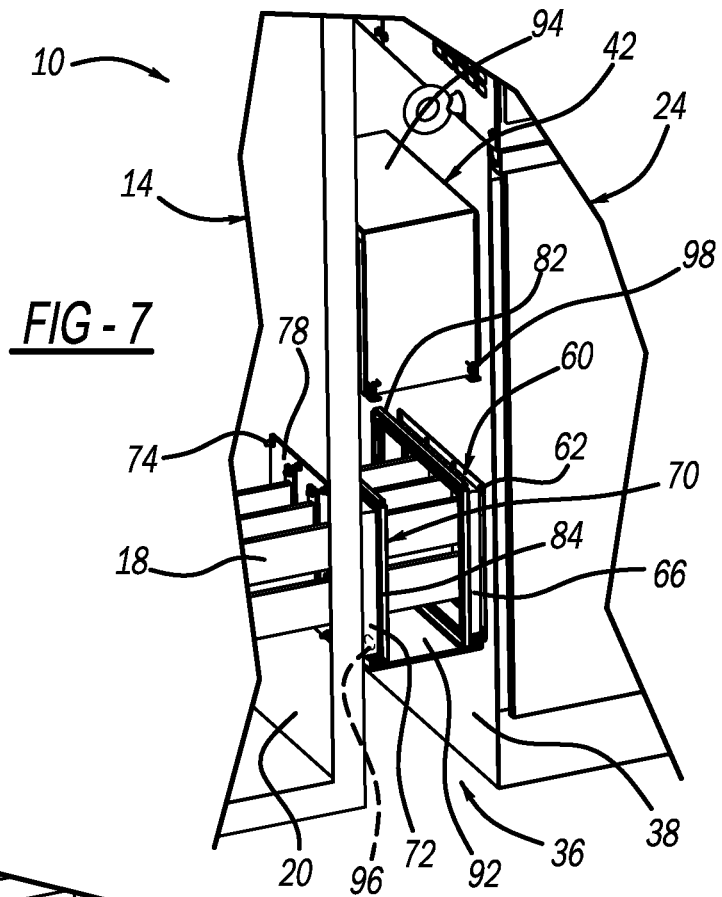
FIG. 7 is a broken-away isometric view of the equipment assembly shown in FIG. 1 showing the duct being mounted to the frames.

FIG. 7 is a broken-away isometric view of the equipment assembly 10 showing a metal bottom panel 92 of the duct 42 positioned relative to a bottom rail of the frames 60 and 70 and a three-sided metal cover 94 of the duct 42 positioned relative to top and side rails of the frames 60 and 70. Drain holes 96, shown in phantom, are provided in the panel 92 between the wall 20 and the gasket 84 and between the wall 38 and the gasket 82 so that water that flows down the walls 20 and 38 does not collect in the duct assembly 40. It is noted that the duct 42 can have any suitable length for any reasonably sized gap between the cabinets 14 and 24.

Figure 8:
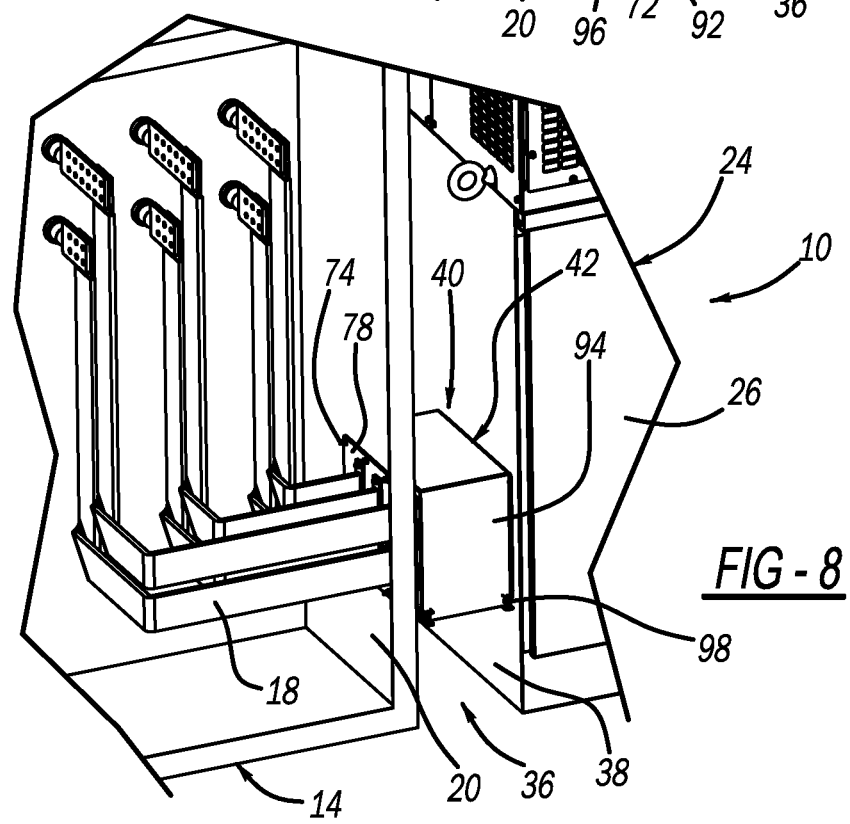
FIG. 8 is a broken-away isometric view of the equipment assembly shown in FIG. 1 with the duct assembly assembled.

FIG. 8 is a broken-away isometric view of the equipment assembly 10 showing the cover 94 being bolted to the bottom panel 92 by bolts 98 so that the duct 42 compresses the gaskets 82 and 84 to provide a flexible seal therebetween all of the way around the frames 60 and 70, which provides a seal against moisture, bugs, animals, etc. gaining access to the buses 18, where end edges of the duct 42 do not contact the walls 20 and 38. Therefore, any motion or misalignment between the cabinets 14 and 24 is corrected by the flexible coupling between the duct 42 and the gaskets 82 and 84.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. An equipment assembly comprising:
a first enclosure defined by a number of walls, wherein one of the walls in the first enclosure has a first opening;
a second enclosure defined by a number of walls, wherein one of the walls in the second enclosure has a second opening, and wherein the first and second enclosures are adjacent to each other and define a gap therebetween so that the first opening and the second opening are aligned, and wherein connections extend from the first enclosure through the first opening, across the gap and into the second enclosure through the second opening;
a first frame mounted to the wall in the first enclosure having the first opening and extending into the gap, said first frame including a first gasket extending all of the way around the first frame;
a second frame mounted to the wall in the second enclosure having the second opening and extending into the gap, said second frame including a second gasket extending all of the way around the second frame; and
a duct coupled to only the first and second gaskets, said duct enclosing the connections extending across the gap, wherein the duct includes a bottom panel and a three-sided cover secured to the bottom panel in a manner that causes a compressing force on the first and second gaskets.

2. The equipment assembly according to claim 1 wherein the first and the second frames have U-shaped cross-sections.

3. The equipment assembly according to claim 2 wherein the first frame includes a first flange mounted to the first enclosure and a second flange extending into the gap and defining a channel therebetween, and the second frame includes a third flange mounted to the second enclosure and a fourth flange extending into the gap and defining a channel therebetween, and wherein the first gasket is secured to the second flange and the second gasket is secured to the fourth flange.

4. The equipment assembly according to claim 3 wherein the first and second gaskets are bulb gaskets.

5. The equipment assembly according to claim 1 further comprising a plate secured to the first enclosure and covering the first opening, said plate including a plurality of slots through which the connections extend.

6. The equipment assembly according to claim 1 wherein the first and second frames are four-sided frames.

7. The equipment assembly according to claim 6 wherein the first and second openings and the first and second frames are square or rectangular.

8. The equipment assembly according to claim 1 wherein the first enclosure encloses a transformer and the second enclosure encloses a power converter system.

9. A duct assembly for enclosing connections extending between and through openings in adjacent equipment enclosures, said duct assembly comprising:
- a first frame configured to be mounted to one of the enclosures, said first frame including a first gasket extending all of the way around the first frame;
- a second frame configured to be mounted to the other enclosure, said second frame including a second gasket extending all of the way around the second frame; and
- a duct coupled to the first and second gaskets, said duct enclosing the connections extending across a gap, wherein the duct includes a bottom panel and a three-sided cover secured to the bottom panel in a manner that causes a compressing force on the first and second gaskets.

10. The duct assembly according to claim 9 wherein the first and the second frames have U-shaped cross-sections.

11. The duct assembly according to claim 10 wherein the first frame includes a first flange mounted to the one enclosure and a second flange spaced therefrom, and the second frame includes a third flange mounted to the other enclosure and a fourth flange spaced therefrom, and wherein the first gasket is secured to the second flange and the second gasket is secured to the fourth flange.

12. The duct assembly according to claim 11 wherein the first and second gaskets are bulb gaskets.

13. The duct assembly according to claim 9 wherein the frames are square or rectangular.

14. An equipment assembly comprising:
- a first enclosure defined by a number of walls, wherein one of the walls in the first enclosure has a first opening;
- a second enclosure defined by a number of walls, wherein one of the walls in the second enclosure has a second opening, and wherein the first and second enclosures are adjacent to each other and define a gap therebetween so that the first opening and the second opening are aligned, and wherein connections extend from the first enclosure through the first opening, across the gap and into the second enclosure through the second opening;
- a four-sided first frame mounted to the wall in the first enclosure having the opening, wherein the first frame includes a first flange mounted to the first enclosure and a second flange extending into the gap and defining a channel therebetween, said first frame including a first bulb gasket mounted to the second flange and extending all of the way around the first frame;
- a four-sided second frame mounted to the wall in the second enclosure having the opening, wherein the second frame includes a third flange mounted to the second enclosure and a fourth flange extending into the gap and defining a channel therebetween, said second frame including a second bulb gasket mounted to the fourth flange and extending all of the way around the second frame; and
- a duct including a bottom panel and a three-sided cover secured to the bottom panel in a manner that causes a compressing force on the first and second bulb gaskets.

15. The equipment assembly according to claim 14 wherein the first and second openings and the first and second frames are square or rectangular.

16. The equipment assembly according to claim 14 wherein the first enclosure encloses a transformer and the second enclosure encloses a power converter system.

* * * * *